United States Patent
Wang et al.

(10) Patent No.: US 12,264,979 B2
(45) Date of Patent: Apr. 1, 2025

(54) FORCE SENSING DEVICE AND SENSOR AND PIEZOELECTRIC ELEMENT THEREOF

(71) Applicant: NATIONAL SUN YAT-SEN UNIVERSITY, Kaohsiung (TW)

(72) Inventors: Yu-Jen Wang, Kaohsiung (TW); Yu-Jan Lo, Kaohsiung (TW); Ren-Yi Huang, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 778 days.

(21) Appl. No.: 17/549,995

(22) Filed: Dec. 14, 2021

(65) Prior Publication Data

US 2023/0122971 A1    Apr. 20, 2023

(30) Foreign Application Priority Data

Oct. 18, 2021    (TW) ................. 110138618

(51) Int. Cl.
| | | |
|---|---|---|
| *H01L 41/113* | (2006.01) | |
| *G01L 1/16* | (2006.01) | |
| *H10N 30/30* | (2023.01) | |
| *H10N 30/80* | (2023.01) | |

(52) U.S. Cl.
CPC .............. *G01L 1/16* (2013.01); *H10N 30/302* (2023.02); *H10N 30/802* (2023.02)

(58) Field of Classification Search
CPC .... H10N 30/30; H10N 30/302; H10N 30/304; H10N 30/306; H10N 30/308; H10N 30/802

USPC ........................... 310/328, 338, 339
See application file for complete search history.

(56) References Cited

U.S. PATENT DOCUMENTS

| | | | | |
|---|---|---|---|---|
| 2007/0080608 A1* | 4/2007 | Maruyama | ............. | H10N 30/50 310/317 |
| 2008/0303782 A1* | 12/2008 | Grant | ............. | G06F 3/016 345/173 |
| 2012/0204656 A1 | 8/2012 | Suzuki | | |
| 2016/0306481 A1 | 10/2016 | Filiz et al. | | |
| 2017/0356812 A1 | 12/2017 | Madden et al. | | |

OTHER PUBLICATIONS

Taiwanese Office Action mailed Apr. 17, 2023 for Taiwanese Patent Application No. 110138618, 5 pages.
Taiwanese Office Action mailed Oct. 5, 2022 for Taiwanese Patent Application No. 110138618, 6 pages.

* cited by examiner

*Primary Examiner* — Derek J Rosenau
(74) *Attorney, Agent, or Firm* — Demian K. Jackson; Jackson IPG PLLC (57) ABSTRACT

A force sensing device is mounted on a tool to sense force, particularly quasi-static and static forces. The force sensing device includes at least one a sensor. A piezoelectric element in the sensor includes a driving portion and a sensing portion. A first voltage is input to the driving portion to generate a vibration in the piezoelectric element and a second voltage in response to the vibration is output from the sensing portion. The second voltage output from the sensing portion is changed as the vibration in the piezoelectric element is suppressed by an external force acting on the force sensing device so variation of the second voltage can be used to measure the external force.

14 Claims, 7 Drawing Sheets

FORCE SENSING DEVICE AND SENSOR AND PIEZOELECTRIC ELEMENT THEREOF

FIELD OF THE INVENTION

This invention relates to a force sensing device and its sensor and piezoelectric element, and more particularly to a force sensing device, sensor and piezoelectric element provided for measurement of quasi-static force and static force.

BACKGROUND OF THE INVENTION

In conventional piezoelectric force and torque sensor, force can be measured by inducing direct piezoelectric effect in the piezoelectric material. Electric charges generated due to direct piezoelectric effect usually decay quickly so the conventional force sensor is unsuitable for sensing quasi-static force and static force such as tiny force generated by ultrasonic processing tool and ultrasonic surgery tool.

SUMMARY

One object of the present invention is to provide a driving portion and a sensing portion on a piezoelectric element, a first voltage is applied to the driving portion to vibrate the piezoelectric element and a second voltage in response to vibration in the piezoelectric element is output from the sensing portion. An external force acting on the piezoelectric element can suppress the vibration of the piezoelectric element and further change the second voltage output from the sensing portion. For this reason, the external force can be measured through value variation of the second voltage.

A force sensing device of the present invention includes at least one upper base, a lower base and at least one first sensor located between the upper and lower bases. The first sensor includes an upper casing and a piezoelectric element. The upper casing is provided to cover and contact the piezoelectric element and located between the upper base and the piezoelectric element. The piezoelectric element includes a driving portion and a sensing portion, a first voltage can be input into the driving portion to generate a vibration in the piezoelectric element, and a second voltage can be output from the sensing portion which is provided to sense the vibration transmitted from the driving portion. While an external force is acting on the upper base and transmitted to the piezoelectric element through the upper base and the upper casing, the vibration in the piezoelectric element is suppressed so as to change the second voltage output from the sensing portion. Thus, the strength of the external force can be measured according to variation of the second voltage.

A sensor of a force sensing device of the present invention includes an upper casing and a piezoelectric element. The upper casing is provided to cover and contact the piezoelectric element. The piezoelectric element includes a driving portion and a sensing portion, a first voltage can be input into the driving portion to generate a vibration in the piezoelectric element, and a second voltage can be output from the sensing portion which is provided to sense the vibration transmitted from the driving portion. While an external force is acting on the upper casing and transmitted to the piezoelectric element, the vibration in the piezoelectric element is suppressed so as to change the second voltage output from the sensing portion. Thus, the strength of the external force can be measured according to variation of the second voltage.

A piezoelectric element of a force sensing device of the present invention includes a driving portion and a sensing portion. A first voltage can be input into the driving portion to generate a vibration in the piezoelectric element, and a second voltage can be output from the sensing portion which is provided to sense the vibration transmitted from the driving portion. As an external force is acting on the piezoelectric element, the vibration in the piezoelectric element is suppressed so as to change the second voltage output from the sensing portion. Thus, the strength of the external force can be estimated based on variation of the second voltage.

Because of the driving portion used to generate vibration in the piezoelectric element and the sensing portion used to sense vibration in the piezoelectric element, it is possible to measure the external force acting on the force sensing device based on the variation of the second voltage output from the sensing portion.

DETAILED DESCRIPTION OF THE INVENTION

Figure 1:
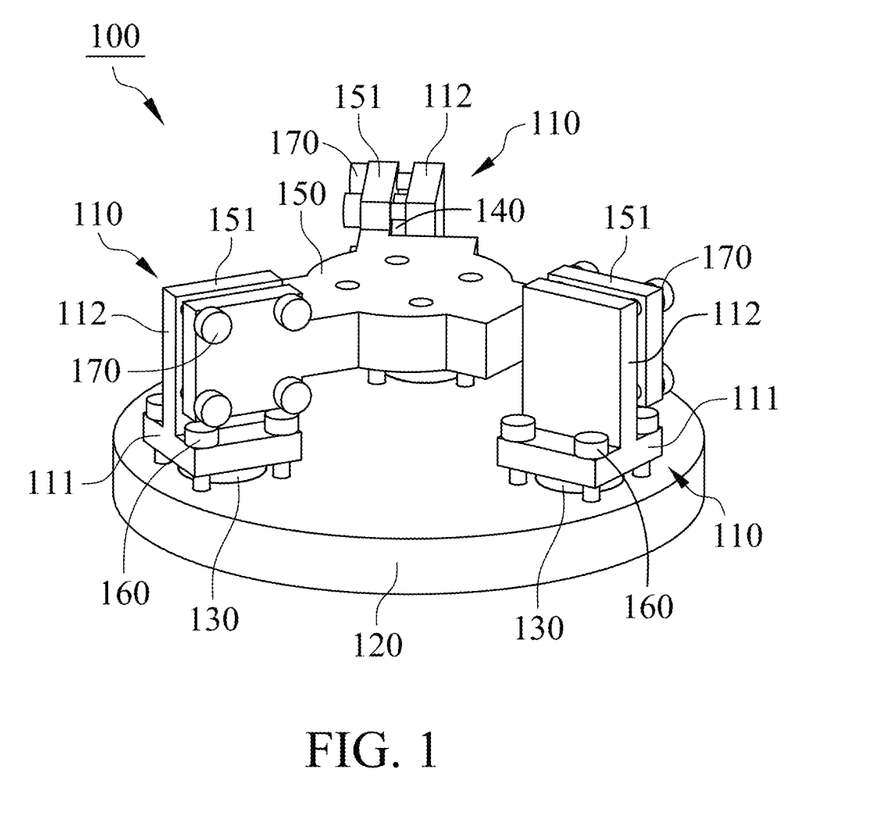
FIG. 1 is a perspective assembly diagram illustrating a force sensing device in accordance with one embodiment of the present invention.
Figure 5:
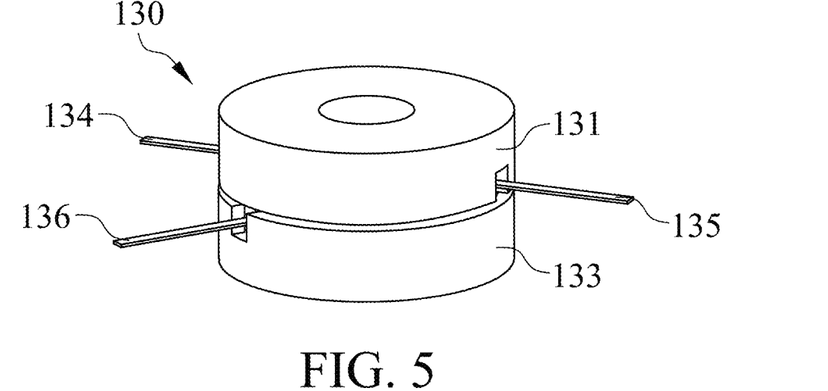
FIG. 5 is a perspective assembly diagram illustrating a force sensing device/sensor in accordance with one embodiment of the present invention.
Figure 8:
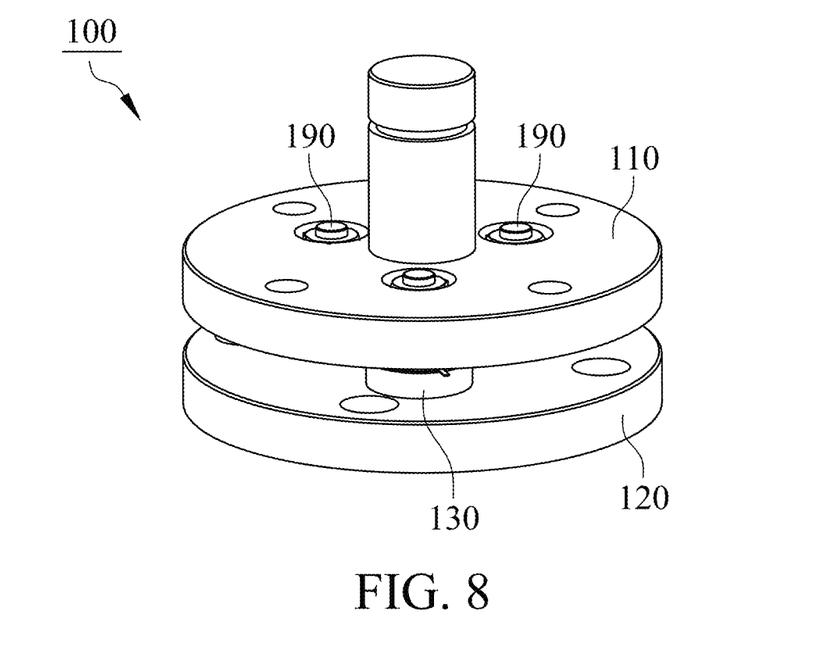
FIG. 8 is a perspective assembly diagram illustrating a force sensing device in accordance with one embodiment of the present invention.

A force sensing device of the present invention may be a single-axis force sensing device as shown in FIG. 5, a six-axis force sensing device as shown in FIG. 1, or a three-axis force sensing device as shown in FIG. 8.

With reference to FIGS. 1 to 7, a force sensing device 100 includes at least one upper base 110, a lower base 120, at least one first sensor 130, at least one second sensor 140 and a carrier 150. In a first embodiment of the present invention, the force sensing device 100 is a six-axis force sensing device and includes three upper bases 110, one lower base 120, three first sensors 130, three second sensors 140 and one carrier 150. The carrier 150 includes at least one arm 151, and the first and second sensors 130 and 140 may be the same or different.

With reference to FIGS. 1 to 4, preferably, the carrier 150 includes three arms 151 and each of the upper bases 110 includes a first base part 111 and a second base part 112 which are connected to each other. Each of the first sensors 130 is placed between one of the upper bases 110 and the lower base 120. And in this embodiment, each of the first sensors 130 is placed between the first base part 111 of one of the upper bases 110 and the lower base 120. Preferably, each of the upper bases 110 is connected to the lower base 120 by a first connector 160 to allow each of the first sensors 130 to be clamped between one of the upper bases 110 and the lower base 120. Each of the second sensors 140 is placed between the second base part 112 of one of the upper bases 110 and one of the arms 151 of the carrier 150, and preferably, at least one second connector 170 is provided to connect the second base part 112 and the arm 151 so as to clamp each of the second sensors 140 between the second base part 112 and the arm 151. The carrier 150 is suspended over (located above) the lower base 120.

Figure 2:
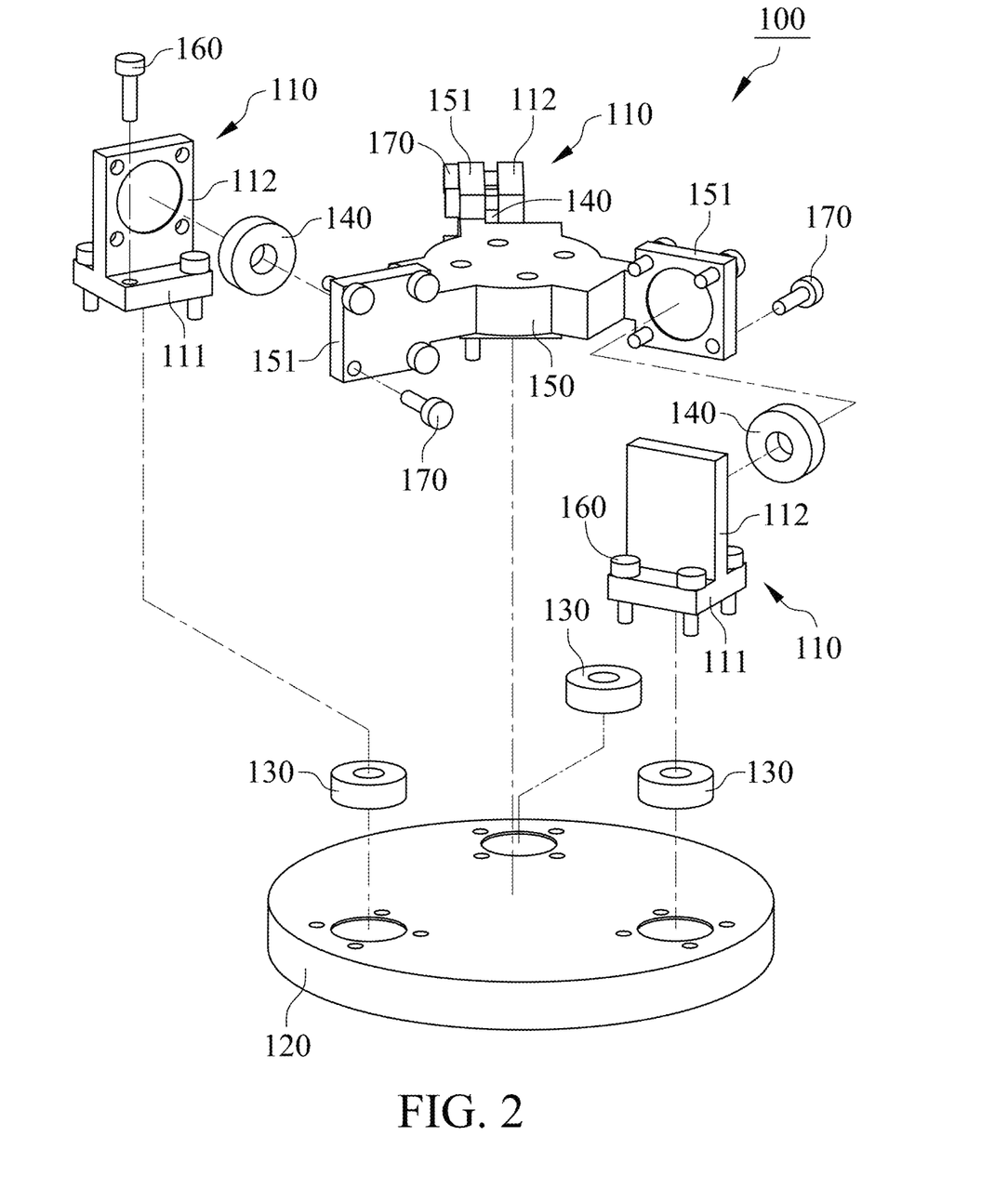
FIG. 2 is a perspective exploded diagram illustrating the force sensing device in accordance with one embodiment of the present invention.
Figure 3:
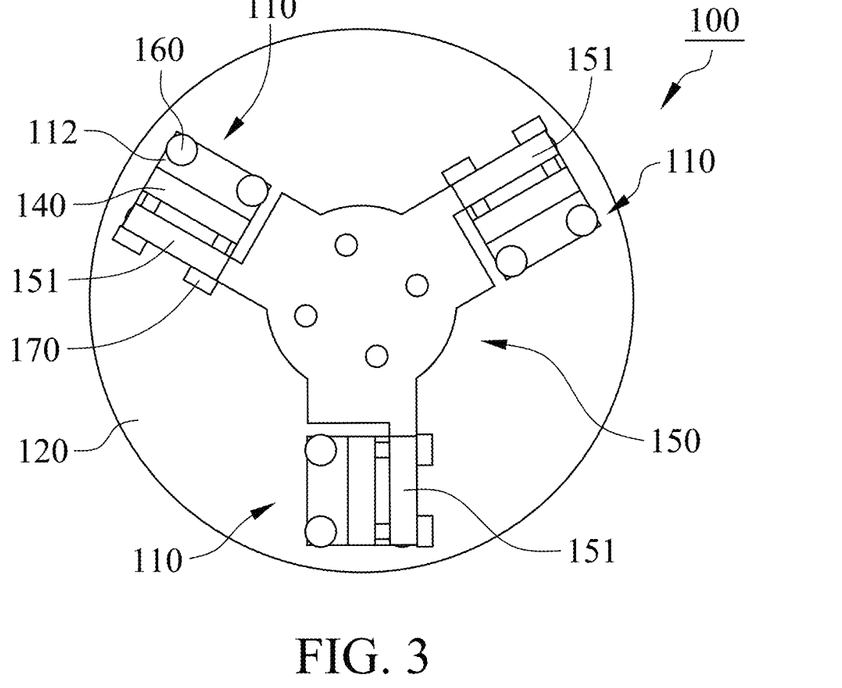
FIG. 3 is a top view diagram illustrating the force sensing device in accordance with one embodiment of the present invention.
Figure 7:
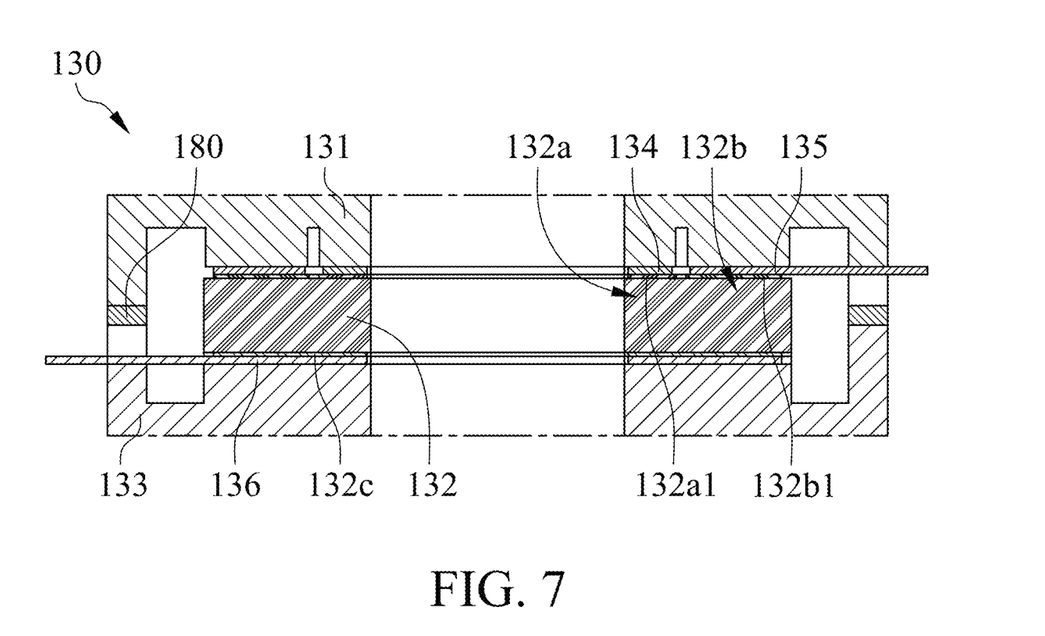
FIG. 7 is a cross-section view diagram illustrating the force sensing device/sensor in accordance with one embodiment of the present invention.

With reference to FIGS. 2, 5 and 7, the first sensor 130 includes an upper casing 131 and a piezoelectric element 132 which is but not limit to made of piezoelectric ceramic. The upper casing 131 covers the piezoelectric element 132 and is located between the upper base 110 and the piezoelectric element 132. Preferably, the first sensor 130 further includes a lower casing 133, the piezoelectric element 132 is located between the upper casing 131 and the lower casing 133, and the upper casing 131 is in contact with the piezoelectric element 132. In this embodiment, the upper casing 131 is connected to the lower casing 133 by an adhesive 180 such that the piezoelectric element 132 is clamped between the upper casing 131 and the lower casing 133 and applied with a preload by means of the upper casing 131 and the lower casing 133.

Figure 6:
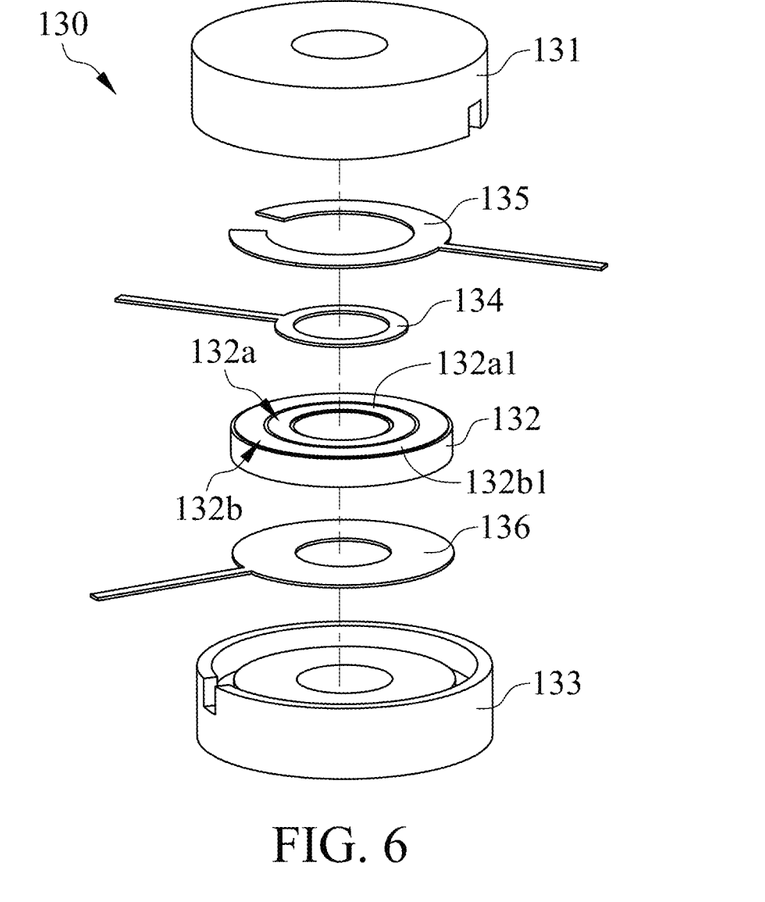
FIG. 6 is a perspective exploded diagram illustrating the force sensing device/sensor in accordance with one embodiment of the present invention.

With reference to FIGS. 5 to 7, the piezoelectric element 132 includes a driving portion 132a and a sensing portion 132b. A first voltage can be applied to the driving portion 132a to generate vibration in the piezoelectric element 132, and the sensing portion 132b can sense the vibration transmitted from the driving portion 132a to output a second voltage. Preferably, the driving portion 132a and the sensing portion 132b are located on the same side of the piezoelectric element 132.

With reference to FIGS. 5 to 7, the first sensor 130 further includes a first electrode slice 134 and a second electrode slice 135, the first electrode slice 134 is electrically connected to a driving electrode 132a1 of the driving portion 132a, and the second electrode slice 135 is electrically connected to a sensing electrode 132b1 of the sensing portion 132b. In this embodiment, the first sensor 130 further includes a third electrode slice 136 which is electrically connected to a ground electrode 132c on the piezoelectric element 132. The driving electrode 132a1 is surrounded by the sensing electrode 132b1, the first electrode slice 134 is surrounded by the second electrode slice 135, the upper casing 131 is in contact with the first electrode slice 134 and the second electrode slice 135. The first electrode slice 134 is located between the driving electrode 132a1 and the upper casing 131, and the second electrode slice 135 is located between the sensing electrode 132b1 and the upper casing 131.

Figure 4:
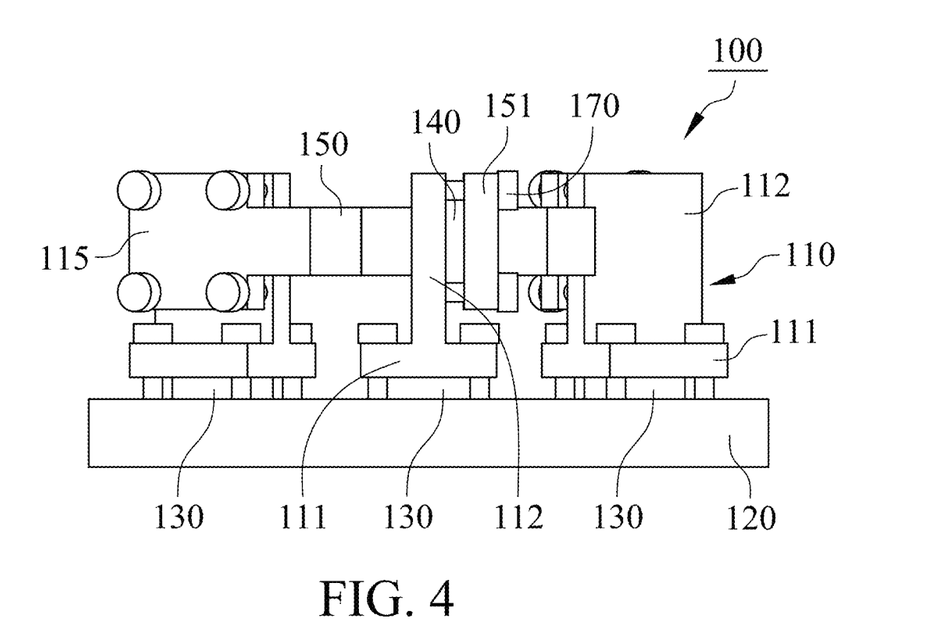
FIG. 4 is a lateral view diagram illustrating the force sensing device in accordance with one embodiment of the present invention.

With reference to FIGS. 1 to 7, as the force sensing device 100 is provided to sense force such as quasi-static force, static force and dynamic force, the first voltage is input to the driving electrode 132a1 via the first electrode slice 134 to generate a vibration in the piezoelectric element 132, and the second voltage in response to the vibration is output from the sensing portion 132b as it senses the vibration transmitted from the driving portion 132a. With reference to FIGS. 1 and 4, while an external force is acting on the carrier 150, the external force is propagated from the arm 151 of the carrier 150 to the second sensor 140, from the second sensor 140 to the upper base 110, and then the external force applied to the upper base 110 is propagated to the first sensor 130.

With reference to FIGS. 6 and 7, the external force which is transmitted to the second sensor 140 via the arm 151 of the carrier 150 or transmitted to the first sensor 130 via the upper base 110 is transmitted to the piezoelectric element 132 via the upper casing 131 to suppress the vibration amplitude of the piezoelectric element 132 so as to change the second voltage output from the sensing portion 132b. Consequently, the variation of the second voltage output from the sensing portion 132b can be used to measure the strength of the external force for six-axis force sensing.

In a second embodiment of the present invention, the force sensing device is a single-axis force sensing device as shown in FIGS. 5 to 7. Different to the six-axis force sensing device of the first embodiment mentioned above, there is only one first sensor 130 used in the single-axis force sensing device of the second embodiment. The first sensor 130 includes the upper casing 131 and the piezoelectric element 132, and preferably further includes the lower casing 133. The upper casing 131 and the lower casing 133 are connected to each other by the adhesive 180 to clamp the piezoelectric element 132 and apply a preload force on the piezoelectric element 132. In the second embodiment, the external force is acting on the upper casing 131 for force detection.

With reference to FIGS. 5 to 7, identical to six-axis force sensing, during single-axis force sensing using the first sensor 130, a first voltage is input to the driving electrode 132a1 via the first electrode slice 134 to produce a vibration in the piezoelectric element 132, and a second voltage in response to the vibration is output from the sensing portion 132b. When an external force is applied to the upper casing 131, the external force is transmitted to the piezoelectric element 132 from the upper casing 131 to limit the vibration in the piezoelectric element 132 and also change the value of the second voltage output from the sensing portion 132b. Hence, the first sensor 130 can be used to sense single-axis force according to the variation of the second voltage output from the sensing portion 132b.

Figure 9:
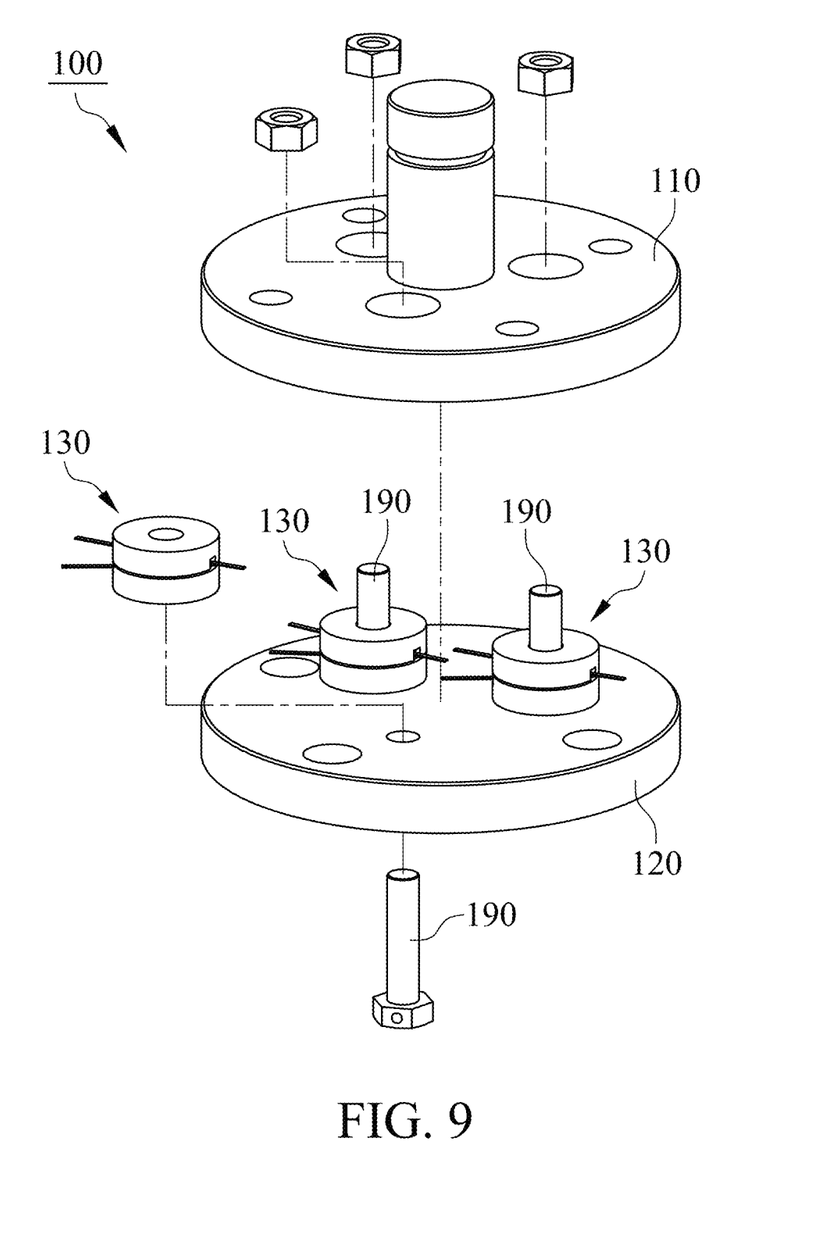
FIG. 9 is a perspective exploded diagram illustrating the force sensing device in accordance with one embodiment of the present invention.
Figure 10:
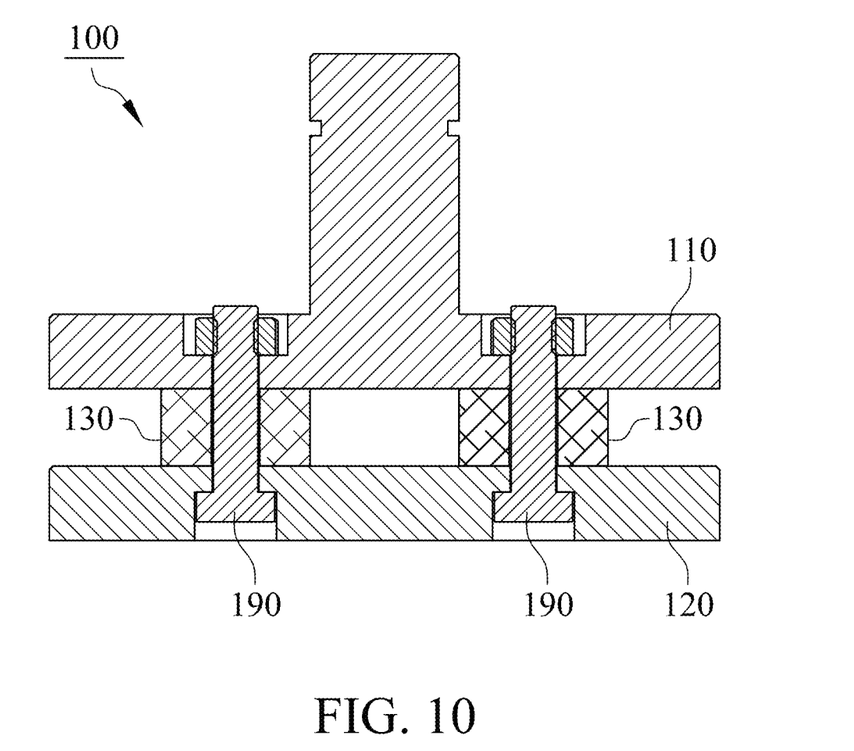
FIG. 10 is a cross-section view diagram illustrating the force sensing device in accordance with one embodiment of the present invention.

A three-axis force sensing device shown in FIGS. 8 to 10 is a force sensing device 100 of a third embodiment of the present invention. Different to the six-axis force sensing device in the first embodiment, the three-axis force sensing device 100 of the third embodiment requires three first sensors 130 and the upper base 110 is provided to be applied with an external force. With reference to FIGS. 8 to 10, the first sensors 130 are installed between the upper base 110 and the lower base 120 which are connected to each other by three third connectors 190. Each of the third connectors 190 is inserted through the lower base 120, the first sensor 130 and the upper base 110 to allow the first sensors 130 to be clamped between the upper base 110 and the lower base 120. In the third embodiment, each of the third connectors 190 involves a screw and a nut.

Identically, during three-axis force sensing using the force sensing device 100 shown in FIGS. 8 to 10, a first voltage is applied to the driving electrode 132a1 through the first electrode slice 134 to generate a vibration in each of the piezoelectric elements 132, and a second voltage in response to the vibration transmitted from the driving portion 132a is output from the sensing portion 132b. As an external force is acting on the upper base 110, the external force is transmitted from the upper base 110 to the upper casing 131 and then transmitted from the upper casing 131 to the piezoelectric elements 132. The external force acting on the piezoelectric elements 132 can suppress the vibration in the piezoelectric elements 132 to change the second voltage output from the sensing portion 132b. Accordingly, the strength of the three-axis force can be obtained through the variation of the second voltage output from the sensing portion 132b.

The piezoelectric element 132 is vibrated by the first voltage input into the driving portion 132a to output the second voltage from the sensing portion 132b. While the vibration in the piezoelectric element 132 is suppressed by force acting on the force sensing device 100, the second voltage output from the sensing portion 132b is changed so that force sensing according to the variation of the second voltage is practical. The six-axis force sensing device shown in FIG. 1, the three-axis force sensing device shown in FIG. 8 and the single-axis force sensing device shown in FIG. 5 can be used for sensing quasi-static force, static force or dynamic force in micro-vibration detection tool, ultrasonic processing machine or ultrasonic surgery apparatus.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A force sensing device comprising:
    at least one upper base;
    a lower base; and
    at least one first sensor disposed between the at least one upper base and the lower base and including an upper casing and a piezoelectric element, the upper casing is configured to cover and contact the piezoelectric element and located between the at least one upper base and the piezoelectric element, the piezoelectric element includes a driving portion and a sensing portion, the driving portion is configured to be applied with a first voltage to generate a vibration in the piezoelectric element, the sensing portion is configured to sense the vibration transmitted from the driving portion to output a second voltage, wherein when an external force is applied to the upper base, the external force is transmitted from the at least one upper base and the upper casing to the piezoelectric element and configured to suppress the vibration in the piezoelectric element and change the second voltage output from the sensing portion such that the external force is configured to be measured using variation of the second voltage.

2. The force sensing device in accordance with claim 1, wherein the driving portion and the sensing portion are located on the same side of the piezoelectric element.

3. The force sensing device in accordance with claim 1, wherein the at least one first sensor further includes a first electrode slice and a second electrode slice, the first electrode slice is configured to be electrically connected to a driving electrode of the driving portion, the second electrode slice is configured to be electrically connected to a sensing electrode of the sensing portion, and the upper casing is configured to contact the first and second electrode slices.

4. The force sensing device in accordance with claim 3, wherein the first electrode slice is located between the driving electrode and the upper casing, and the second electrode slice is located between the sensing electrode and the upper casing.

5. The force sensing device in accordance with claim 1, wherein the at least one first sensor further includes a lower casing, the piezoelectric element is disposed between the upper and lower casings, the upper and lower casings are connected to each other and configured to apply a preload on the piezoelectric element.

6. The force sensing device in accordance with claim 1 further comprising at least one second sensor and a carrier, wherein the at least one upper base includes a first base part and a second base part which are connected to each other, the at least one first sensor is disposed between the first base part and the lower base, the at least one second sensor is disposed between the second base part and an arm of the carrier, the arm and the second base part are connected to each other, and the carrier is located above the lower base.

7. The force sensing device in accordance with claim 3 further comprising at least one second sensor and a carrier, wherein the at least one upper base includes a first base part and a second base part which are connected to each other, the at least one first sensor is disposed between the first base part and the lower base, the at least one second sensor is disposed between the second base part and an arm of the carrier, the arm and the second base part are connected to each other, and the carrier is located above the lower base.

8. A sensor of force sensing device comprising:
    an upper casing; and
    a piezoelectric element including a driving portion and a sensing portion, the driving portion is configured to be applied with a first voltage to generate a vibration in the piezoelectric element, the sensing portion is configured to sense the vibration transmitted from the driving portion to output a second voltage, the upper casing is configured to cover and contact the piezoelectric element, wherein when an external force is applied to the upper casing, the external force is transmitted from the upper casing to the piezoelectric element and configured to suppress the vibration in the piezoelectric element and change the second voltage output from the sensing portion such that the external force is configured to be measured using variation of the second voltage.

9. The sensor of force sensing device in accordance with claim 8, wherein the driving portion and the sensing portion are located on the same side of the piezoelectric element.

10. The sensor of force sensing device in accordance with claim 8 further comprising a first electrode slice and a second electrode slice, wherein the first electrode slice is configured to be electrically connected to a driving electrode of the driving portion, the second electrode slice is configured to be electrically connected to a sensing electrode of the sensing portion, and the upper casing is configured to contact the first and second electrode slices.

11. The sensor of force sensing device in accordance with claim 10, wherein the first electrode slice is located between the driving electrode and the upper casing, and the second electrode slice is located between the sensing electrode and the upper casing.

12. The sensor of force sensing device in accordance with claim 8 further comprising a lower casing, wherein the piezoelectric element is disposed between the upper and lower casings, the upper and lower casings are connected to each other and configured to apply a preload on the piezoelectric element.

13. A piezoelectric element of force sensing device comprising:
 a driving portion configured to be applied with a first voltage to generate a vibration in the piezoelectric element; and
 a sensing portion configured to sense the vibration transmitted from the driving portion to output a second voltage, wherein when an external force is applied to the piezoelectric element, the external force is configured to suppress the vibration in the piezoelectric element and change the second voltage output from the sensing portion such that the external force is configured to be measured using variation of the second voltage.

14. The piezoelectric element of force sensing device in accordance with claim 13, wherein the driving portion and the sensing portion are located on the same side of the piezoelectric element.

\* \* \* \* \*